United States Patent [19]
Jeon

[11] Patent Number: 5,747,374
[45] Date of Patent: May 5, 1998

[54] METHODS OF FABRICATING BIPOLAR TRANSISTORS HAVING SEPARATELY FORMED INTRINSIC BASE AND LINK-UP REGIONS

[75] Inventor: Hee-Seog Jeon, Seoul, Rep. of Korea

[73] Assignee: Samsung Electronics Co., Ltd., Kyungki-do, Rep. of Korea

[21] Appl. No.: 757,802

[22] Filed: Nov. 27, 1996

[30] Foreign Application Priority Data

Dec. 28, 1995 [KR] Rep. of Korea .................. 95-61307

[51] Int. Cl.$^6$ ................................................. H01L 21/331
[52] U.S. Cl. ..................... 438/309; 438/350; 438/365; 438/366
[58] Field of Search ...................... 437/31, 162, 32; 438/348, 350, 364, 365, 366, 309

[56] References Cited

U.S. PATENT DOCUMENTS

| | | | |
|---|---|---|---|
| 4,545,114 | 10/1985 | Ito et al. | 437/31 |
| 4,746,629 | 5/1988 | Hanagasaki | 437/31 |
| 4,778,774 | 10/1988 | Blossfeld | 438/365 |
| 4,839,305 | 6/1989 | Brighton | 438/366 |
| 4,845,046 | 7/1989 | Shimbo | 437/31 |
| 5,024,956 | 6/1991 | Van Der Velden et al. | 438/366 |
| 5,039,624 | 8/1991 | Kadota | 437/31 |
| 5,488,002 | 1/1996 | Kimura et al. | 438/366 |
| 5,593,905 | 1/1997 | Johnson et al. | 437/31 |

*Primary Examiner*—Tuan H. Nguyen
*Attorney, Agent, or Firm*—Myers Bigel Sibley & Sajovec

[57] ABSTRACT

Methods which provide for the formation of the intrinsic base regions and the link-up regions in separate processing steps are provided. These methods include the steps of forming a first conductive layer on a substrate of a first conductivity type containing a region of a second conductivity type therein, wherein the first conductive layer is formed on the region of second conductivity type semiconductor material. The first conductive layer is patterned to define a sidewall of a window which exposes a portion of the region of a second conductivity type semiconductor material. An insulating layer is formed on the sidewall, the first conductive layer and the exposed portion of the region of second conductivity type semiconductor material. A first mask is then formed on the insulating layer which exposes a region of the insulating layer corresponding to a link-up region of the bipolar transistor. A first impurity ion of a first conductivity type is then implanted through the insulating layer using the first mask to form a link-up region. The first mask may be removed and a sidewall spacer formed on the sidewall. The insulating layer is then removed to expose a region of second conductivity type semiconductor material adjacent the sidewall spacer to define an implantation region for an intrinsic base region. A second impurity ion of the first conductivity type is then implanted in the region of second conductivity type semiconductor material using the sidewall spacer as a mask to form an intrinsic base region. Thus, an intrinsic base region and a link-up region are formed separately.

12 Claims, 5 Drawing Sheets

METHODS OF FABRICATING BIPOLAR TRANSISTORS HAVING SEPARATELY FORMED INTRINSIC BASE AND LINK-UP REGIONS

FIELD OF THE INVENTION

The present invention relates to the fabrication of semiconductor devices, and more particularly, to methods for fabricating bipolar transistors.

BACKGROUND OF THE INVENTION

As state-of-the-art computer systems and circuits evolve, there is a continuing need for higher performance bipolar junction transistors capable of operating at higher switching speeds, with increasing degrees of device integration, and with a low rate of failure. There is also a continuing need to shrink or scale down device size to obtain improved device performance. In order to obtain further advances in device scaling, improved lithographic techniques and equipment must be developed. Unfortunately, the lithographic patterning tolerances of state-of-the-art equipment is rapidly reaching its limits. The range of future device geometries and contact line widths require extremely small dimensions. Thus, lithographic errors within the normal tolerance range can impede efforts to further shrink device size. Accordingly, it would be advantageous to develop processes and device geometries less dependent on photolithographic accuracy.

Attempts to reduce dependency on photolithographic accuracy typically include the steps of self-aligning various active regions of the bipolar junction transistor to each other. In a "self-aligned" process, at least one device region is used as an alignment guide for forming a subsequent region(s). Accordingly, self-aligned fabrication processes are less dependent upon precise photolithographic alignment than similarly directed non self-aligned processes. Faster switching speeds can also be obtained, in part, by reducing the lateral and vertical size and parasitic components of individual transistors and increasing the degree of integration. Typical parasitics include base resistance, $r_b$, base-collector capacitance, $C_{bc}$, collector resistance, $r_c$, and collector-substrate capacitance, $C_{cs}$. As these parasitic components are reduced, device performance improves because faster device operation and lower power consumption is possible.

In bipolar devices, the use of an oxide film separation can reduce the size of the bipolar device but not the distance between contacts of the device. That is, to take into account possible mis-alignment of a mask, a relatively wide inert device region is required for device separation. These inert device regions cause parasitic resistance and capacitance as well as occupy a useful region of silicon.

To reduce the area of the inert device region a double-polysilicon self-aligned structure has been used. According to the double-polysilicon self-aligned structure, an emitter is self-aligned on a base. In forming the double-polysilicon self-aligned structure, a first polysilicon region doped with p-type impurities is formed which is used as a base electrode. A second polysilicon region doped with n-type impurities is also formed and contacts the emitter region. The emitter and extrinsic base are formed from the first and second polysilicons, respectively, using an out-diffusion method. An intrinsic base region contacting the extrinsic base region is formed through ion implantation.

In the double-polysilicon self-aligned structure, a region linking the extrinsic base region and intrinsic base region is called a link-up or graft-base region. The link-up region may have a decisive effect on the characteristics of the bipolar device. The characteristics of the link-up region are largely determined by the distance between the edge of the base region and an emitter contact and by the degree of overlap of the extrinsic base region and the intrinsic base region. The distance between the edge of the base region and an emitter contact is determined by the thickness of an oxide film sidewall spacer formed on a vertical sidewall of $p^+$ silicon. Also, the degree of overlapping between extrinsic and intrinsic base regions depends on the thickness of the spacer and degree of lateral diffusion from $p^+$-polysilicon. Thus, to achieve high yield it may be important to control these factors in fabricating the self-aligned structure.

If there is too great an overlap of the intrinsic base and extrinsic base in the link-up region, the emitter-base junction breakage voltage($BV_{EBO}$), common-emitter current gain($\beta$) and unit-gain frequency($f_T$) may be decreased. However, if the two bases are separated to too great a distance the base serial resistance($R_B$) increases and punch-through voltage decreases.

Figure 1A:
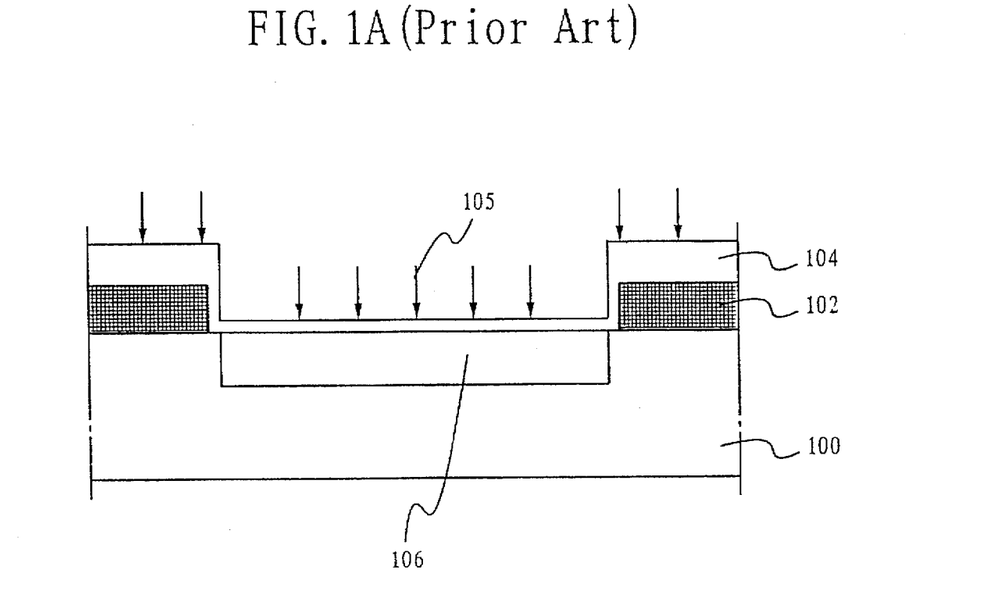
FIGS. 1A to 1C are cross-sectional views illustrating a conventional method for forming a link-up region.
Figure 1B:
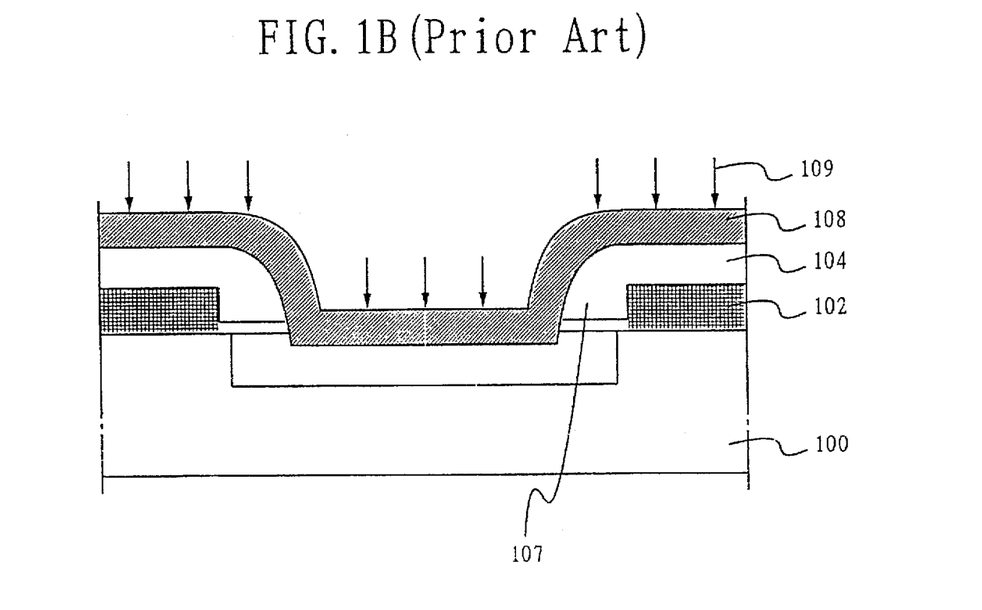
Figure 1C:
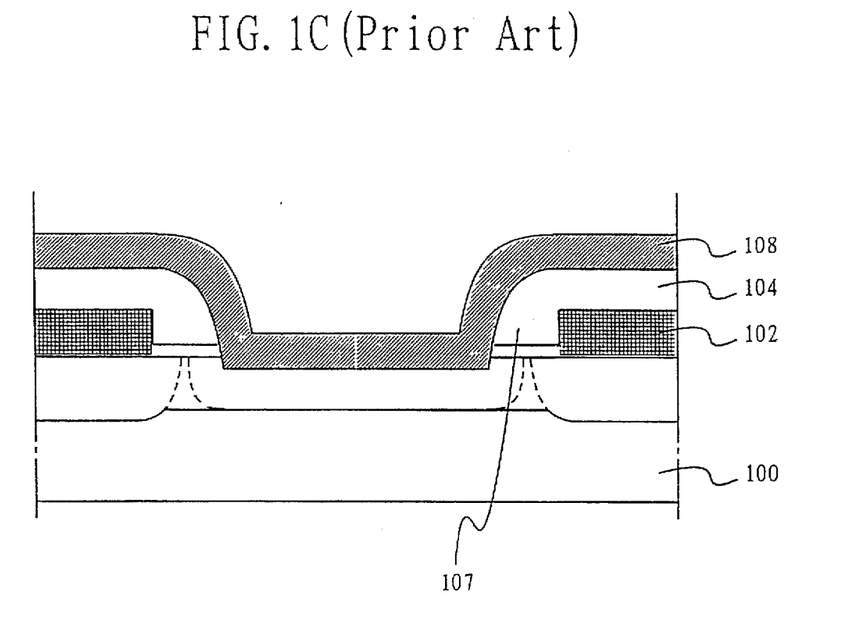

A conventional method for forming the link-up region of a bipolar device is seen in FIGS. 1A to 1C. As seen in FIG. 1A, an $n^+$ buried layer 100 is formed on a silicon substrate. A first polysilicon layer 102 doped with p-type impurities is formed on the buried layer 100. Next, the first polysilicon layer 102 is etched so as to open an emitter contact and then a thin oxide film 104 is grown on the sidewall of the etched first polysilicon layer 102 and the surface of the buried layer 100. Thereafter, p-type impurity ions 105, e.g., $BF_2$ or boron (B) ion, are implanted using a low implant energy to form a link-up region 106 doped with a low concentration of impurity ions.

Referring to FIGS. 1B and 1C, after forming an oxide film sidewall spacer 107 on the sidewall of the first polysilicon layer 102, a second polysilicon layer 108 is deposited on the sidewall spacer and in the emitter contact area. Then, a boron ion 109 is implanted in the second polysilicon layer 108 and diffused to form an intrinsic base region. Afterward, an n-type impurity ion, e.g., arsenic ion, is implanted in the second polysilicon layer 108 and then annealed to form an emitter region.

As is seen in the above described process, the ion concentration of the intrinsic base region is determined by the total ion dose on the link-up ion implantation (shallow $BF_2$ or boron ion implantation) and the intrinsic base ion implantation which is performed after the oxide film sidewall spacer is formed. The ion concentration of the intrinsic base region and the link-up region are dependent on each other in that the concentration of one region is limited to being no less than the lower of the two ion implantations.

Also, because the oxide film sidewall spacer is formed after the link-up ion implantation, the oxide film may be etched through to the underlying layer during the etching process which forms the spacer. As a result, there may be a loss in the underlying layer and a corresponding loss in dopant. Thus, it is difficult to control the concentration of in the region between the sidewall spacers.

SUMMARY OF THE INVENTION

In view of the above, it is an object of the present invention to provide methods of fabricating bipolar junction transistors having link-up regions and intrinsic regions so as to more accurately control the formation of those regions.

Another object of the present invention is to provide methods of fabricating bipolar junction transistors having improved electrical characteristics over existing bipolar junction transistors.

These and other objects of the present invention are provided by methods which provide for the formation of the intrinsic regions and the link-up regions in separate processing steps. These methods include the steps of forming a first conductive layer on a substrate of a first conductivity type containing a region of a second conductivity type therein, wherein the first conductive layer is formed on the region of second conductivity type semiconductor material. The first conductive layer is patterned to define a sidewall of a window which exposes a portion of the region of a second conductivity type semiconductor material. An insulating layer is formed on the sidewall, the first conductive layer and the exposed portion of the region of second conductivity type semiconductor material. A first mask is then formed on the insulating layer which exposes a region of the insulating layer corresponding to a link-up region of the bipolar transistor. A first impurity ion of a first conductivity type is then implanted through the insulating layer using the first mask to form a link-up region.

In further embodiments of the present invention, the first mask is removed and a sidewall spacer formed on the sidewall. The insulating layer is then removed to expose a region of second conductivity type semiconductor material adjacent the sidewall spacer to define an implantation region for an intrinsic base region. A second impurity ion of the first conductive type is then implanted in the region of second conductivity type semiconductor material using the sidewall spacer as a mask to form an intrinsic base region. Thus, an intrinsic base region and a link-up region are formed separately.

Because the intrinsic base region and the link-up region are formed separately, the ion concentration in each region may be independently controlled. Furthermore, because the sidewall spacer is formed before the ion implantation to form the intrinsic base region, the dopant level to form the intrinsic region is not affected by the etching step. This is true even if the etching to form the sidewall spacers etches into the epitaxial layer on which the sidewall spacers are formed. Thus, the ion concentration in the intrinsic region may be more accurately controlled. Finally, because the formation of the intrinsic region and the link-up region may be better controlled the resulting bipolar junction transistor may have more predictable electrical characteristics and thus exhibit improved performance over previous devices.

In addition to the above embodiments, the present invention provides embodiments wherein the sidewall spacer extends to cover the link-up region. Furthermore, the region of second conductivity type semiconductor material may be formed by forming a layer of a second conductivity type semiconductor material on a substrate of a first conductivity type semiconductor material. In such a case the first conductive layer is then formed on the layer of second conductivity type semiconductor material opposite the substrate. Also, the first conductivity type may be p-type conductivity and the second conductivity type may be n-type conductivity. The first conductive layer may be formed of first conductivity type polysilicon.

In another embodiment of the present invention, a second conductive layer is formed on the sidewall spacer and on a portion of the insulating layer corresponding to the intrinsic base region. An insulation film is then formed on exposed surfaces of the device to include at least the second conductive layer. A contact hole is formed in the insulation film a metal contact formed through the contact hole to the second conductive layer to provide an emitter contact.

In a further embodiment of the present invention a method for fabricating a bipolar transistor includes forming a second conductivity type epitaxial layer on a first conductivity type semiconductor substrate. A first polysilicon layer of a first conductivity type is formed on the epitaxial layer opposite the substrate and a first oxide film is formed on the first polysilicon layer opposite the epitaxial layer. The first polysilicon layer and the first oxide film are patterned to form a window which exposes the epitaxial layer. A second oxide film is formed on the exposed epitaxial layer and a layer of a first material is formed on the second oxide film opposite the first oxide film and the exposed epitaxial layer. A layer of a second material is formed on the layer of a first material and opposite the second oxide film. A first sidewall spacer of a third material is formed on the layer of a second material. The exposed layer of a second material is oxidized using the first sidewall spacer as a mask and the first sidewall spacer is removed The layer of a second material and the layer of a first material are then removed using oxidized portions of the layer of second material as a mask to provide a mask for forming a link-up region.

In a further embodiments, a buried layer of a second conductivity type is formed on the substrate and the second conductivity type epitaxial layer is formed on the buried layer opposite the substrate. Additionally, the first oxide film and the first polysilicon layer may be patterned by a photolithographic process to form a window. Also, he first material and the third material may be silicon nitride. The second material may be polysilicon.

In a particular embodiment, the first sidewall spacer is removed by a wet etching process. Non-oxidized portions of the second material layer and the first material layer may also be removed by an isotropic dry etching process.

Further embodiments of the present invention also include implanting a first impurity ion of a first conductivity type the oxidized portions as a mask to form a link-up region. Additionally, the layer of a second material and the layer of a first material may be removed along with the first oxide layer to expose the epitaxial layer within the window. A sidewall spacer may be formed on the sidewall of the window and used as a mask for implanting a second impurity ion of the first conductive type to form an intrinsic base region.

BRIEF DESCRIPTION OF THE DRAWINGS

The objects and advantages of the present invention will become more apparent by describing in detail preferred embodiments thereof with reference to the attached drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type and each embodiment described and illustrated herein includes its complementary embodiment as well. As will be appreciated by those of skill in the art, references herein to a layer formed "on" a substrate or other layer may refer to the layer formed directly on the substrate or other layer or on an intervening layer or layers formed on the substrate or other layer.

Figure 2:
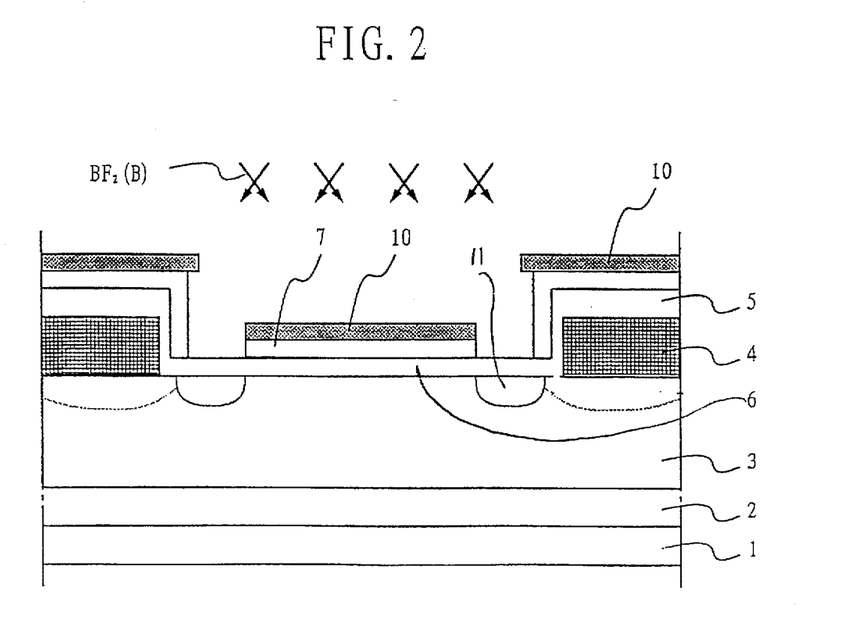
FIG. 2 is a cross-sectional view illustrating a method for forming a link-up region according to the present invention.

FIG. 2 illustrates a mask for forming a link-up region according to the present invention. In FIG. 2 a semiconductor substrate 1 of a first conductivity type such as p-type conductivity has formed on it a buried layer 2 of a second conductivity type such as n-type conductivity. An epitaxial layer 3 of the second conductivity type is also formed on the buried layer 2. The epitaxial layer 3 is typically formed to have a lower second conductivity type doping concentration therein relative to the buried layer 2 which is typically used as an extrinsic collector region. A first polysilicon layer 4 is formed on the epitaxial layer 3 and a first oxide film 5 is formed on the first polysilicon layer 4. The first oxide film 5 and the polysilicon layer 4 are patterned to form a window which exposes the epitaxial layer 3. A second oxide film 6 is formed on the exposed epitaxial layer and on the sidewall of the window. A first material layer 7 and a third oxide film 10 are formed and patterned to provide a mask for implantation of the link-up regions 11.

According to the method for forming the link-up region of the present invention, a region in which an intrinsic base region is to be formed is masked by a multi-layer structure including the second oxide film 6, the first material layer 7 and the third oxide film 10. Thus, only a region to which link-up ion implantation is to be performed is exposed. Thus, the link-up region may be separately formed from the intrinsic base region which may be formed in a subsequent process as described below.

Figure 3A:
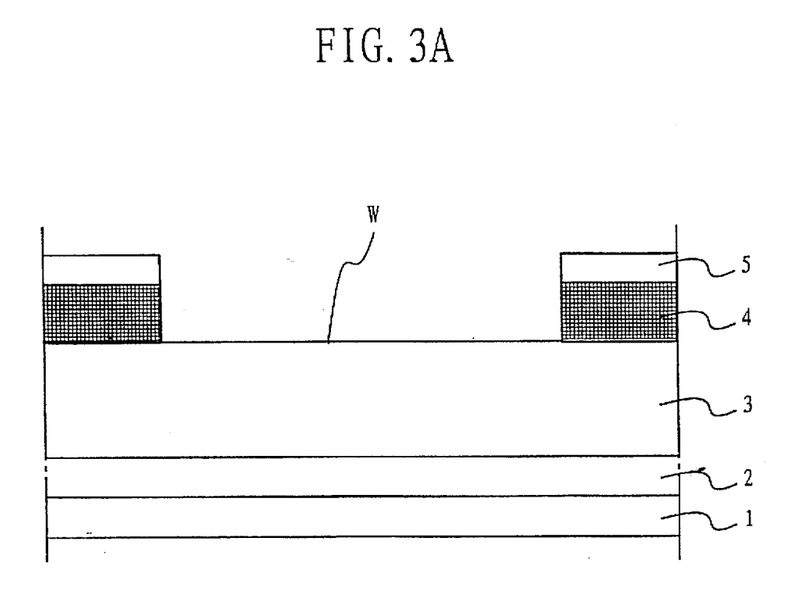
FIGS. 3A to 3F are cross-sectional views illustrating a method for fabricating a bipolar transistor according to the present invention.

FIGS. 3A to 3F are cross-sectional views illustrating a method for fabricating a bipolar transistor according to the present invention. As seen in FIG. 3A, a first polysilicon layer 4 and a first oxide film 5 are formed on an epitaxial layer 3 of a second conductivity type, such as n-type conductivity. The epitaxial layer 3 may be formed on a buried layer 2 of a second conductivity type, such as an $n^+$ buried layer, which is formed on the silicon substrate 1 of a first conductivity type, such as a silicon substrate doped with $p^+$ impurities such as boron.

The first polysilicon layer 4 may be deposited to a thickness of from about 2,000 to about 3,000 Å on the epitaxial layer 3 and then doped with impurities of a first conductivity type, such as $p^+$ impurities. The first oxide film 5 may be deposited to a thickness of from about 2,000 to about 3,000 Å on the first polysilicon layer 4 and may also be doped with $p^+$ impurities. Then, the first polysilicon layer 4 and the first oxide layer 5 are patterned to form a window W which exposes the epitaxial layer 3. As seen in FIG. 3A, the window W has a sidewall which extends from the first epitaxial layer 3 beyond the first polysilicon layer 4 and to the first oxide layer 5.

Figure 3B:
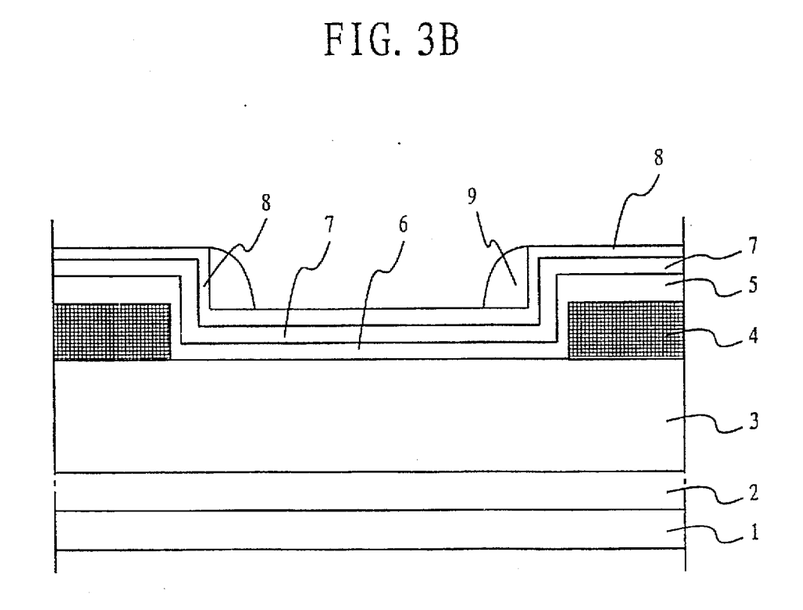

After forming the window W, as seen in FIG. 3B, a second oxide film 6 is formed on the sidewall of the window W and the exposed surface of the epitaxial layer 3. The thin second oxide film 6 may have a thickness of from about 50 to about 250 Å and may be grown on the sidewall of the first polysilicon layer 4 exposed by the window W and on the surface of the epitaxial layer 3 by a thermal oxidation method. A layer 7 of a first material is then formed on the first oxide layer 5 and the second oxide layer 6. The layer 7 of a first material, e.g., a nitride film, may be deposited to a thickness of from about 300 to about 500 Å. A layer 8 of a second material is then formed on the layer 7 of a first material opposite the first oxide layer 5 and the second oxide layer 6. The layer 8 of a second material, e.g., a polysilicon layer, may be deposited on the layer 7 of a first material to a thickness of from about 100 to about 300 Å.

After forming the layer 8 of a second material a first sidewall spacer 9 is formed. The first sidewall spacer 9 may be formed by forming a layer of a third material (not shown), e.g., a nitride film, on the layer 8 of a second material opposite the layer 7 of a first material. This layer of a third material may be deposited on the layer 8 of a second material to a thickness of from about 1,000 to about 2,000 Å. The layer of a third material may then be anisotropically dry etched or otherwise patterned to form the first sidewall spacer 9 made of the third material, such as nitride.

Figure 3C:
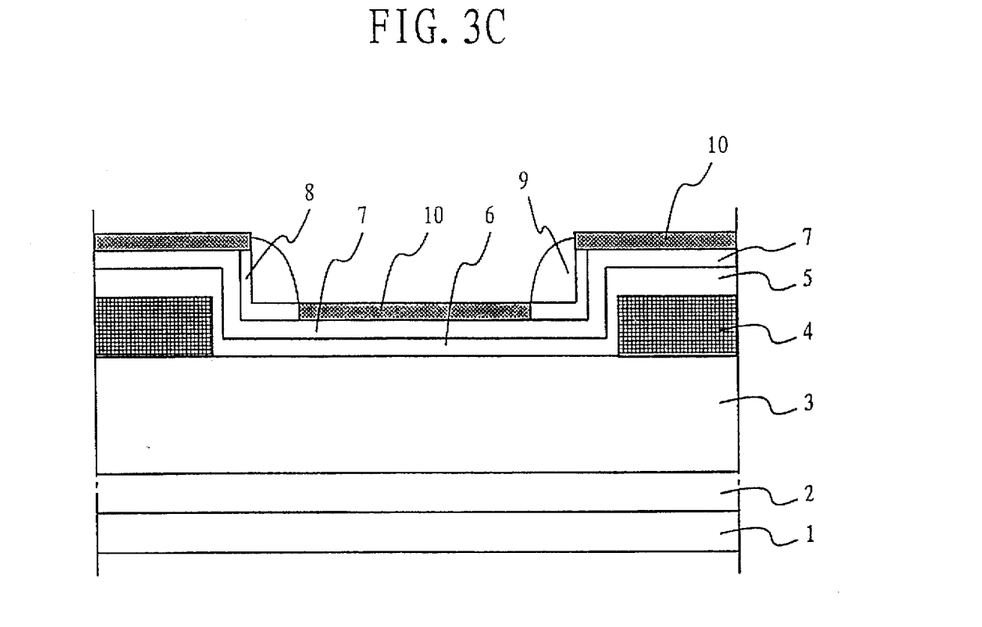

After formation of the structure illustrated in FIG. 3B, a third oxide film 10 is formed as illustrated in FIG. 3C. After formation of the first sidewall spacer 9, a thermal oxidation process is performed to completely oxidize the exposed portions of layer 8 of a second material using the first sidewall spacer 9 as an oxidation mask. As seen in FIG. 3C, the first sidewall spacer prevents oxidation of the portion of the layer 8 of a second material on which the first sidewall spacer 9 is formed. Thus the first sidewall spacer 9 acts as a mask for preventing oxidation of the layer 8 of a second material to thereby form the patterned third oxide film 10.

Figure 3D:
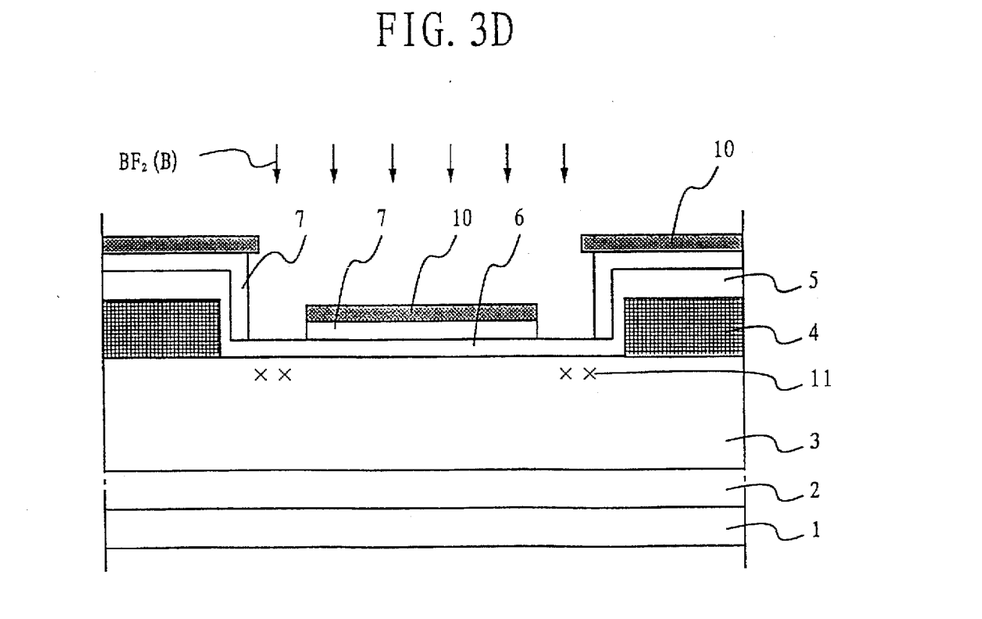

FIG. 3D illustrates a process for forming a link-up region 11. After removing the first sidewall spacer 9 through, for example, a wet etching process using phosphate, the exposed non-oxidized portion of the layer 8 of a second material may be removed by an isotropic dry etch to expose the layer of first material 7, e.g. $Si_3N_4$. After removing the non-oxidized portion of layer 8, the exposed portion of layer 7 of a first material is selectively removed through, for example, a dry etching method. The exposed portion of layer 7 may be removed by using the third oxide film 10 as an etching mask.

As a result of removing the non-oxidized portion of layer 8 and the exposed portion of layer 7, a mask is formed in the window W which exposed areas for formation of the link-up region and masks the areas where the intrinsic base is to be formed. As seen in FIG. 3D, the region where the intrinsic base region is to be formed is masked by a multi-layer structure including the second oxide film 6, the layer 7 of a first material and the third oxide film 10 and only the region where link-up ion implantation is to be performed is exposed. After forming the mask for the link-up implantation, the link-up ion implantation is performed using impurities of a first conductivity type such as $p^+$ impurities, e.g., $BF_2$ or boron ions. Thus, the link-up region 11 is formed.

Figure 3E:
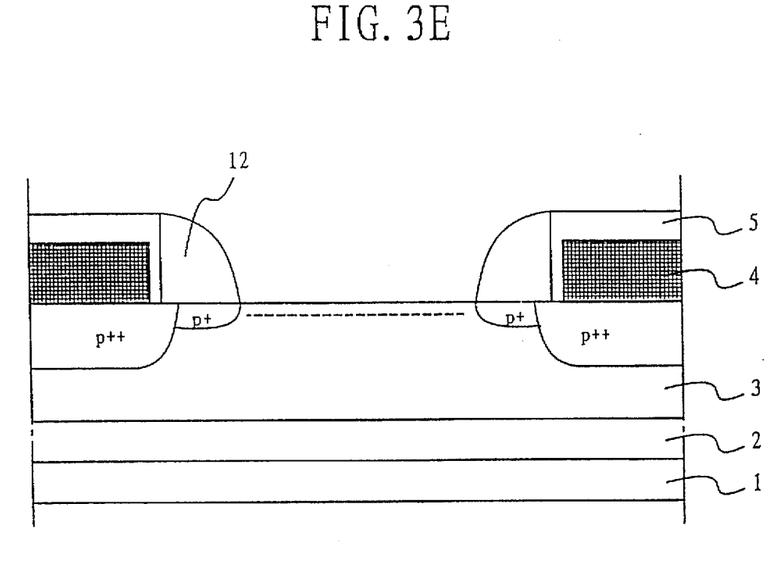

After formation of the link-up region, a mask is formed for formation of the intrinsic base region. As seen in FIG. 3E, a second sidewall spacer 12 is used as a mask for forming the intrinsic region. To form the second sidewall spacer 12, the third oxide film 10 is removed through, for example, a wet etching process. The layer 7 of a first material is then also removed. Then, a fourth oxide film which may be undoped (not shown) is deposited on the first and second oxide films to a thickness of from about 2,000 to about 3,000 Å, The fourth oxide film is then patterned by, for example, an anisotropic dry-etching process to form the second sidewall spacer 12. As illustrated in FIG. 3E the formation of the second sidewall spacer may also remove a portion of the second oxide layer 6 to expose the epitaxial layer in the window W. Furthermore, preferably the second sidewall spacer 12 extends from the sidewall of window W to cover the link-up region.

After forming the sidewall spacer 12 the intrinsic region ion implantation may be performed. Impurities of a first conductivity type, such as p-type impurities may be implanted to a concentration of about $1\times10^{13}$ ions/cm$^2$ or about $1\times10^{14}$ ions/cm$^2$ using the second sidewall spacer 12 as a mask. The implanted impurities may then be diffused by a predetermined thermal process to form the intrinsic base region which is typically more lightly doped than the link-up region 11. Similarly, a diffusion process from the polysilicon layer 4 may be used to form the extrinsic base in the epitaxial layer 3.

Figure 3F:
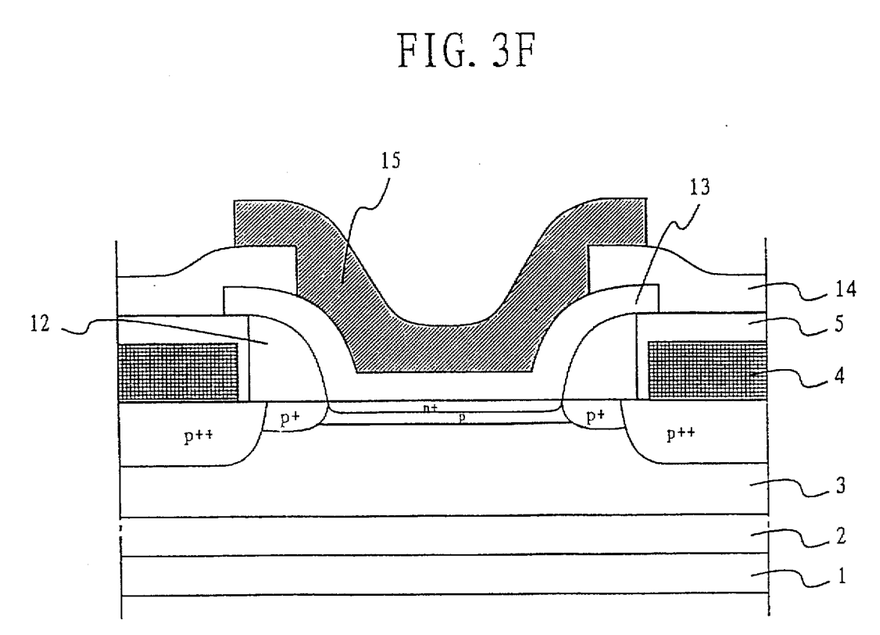

FIG. 3F illustrates the formation of an emitter region of the second conductivity type. As seen in FIG. 3F, a second polysilicon layer 13 is formed on the second sidewall spacer 12 and the exposed epitaxial layer 3 in the window W and doped with second conductivity type impurities such as n$^+$-impurities. The n$^+$ impurities are then diffused by a predetermined thermal process to form the n$^+$-emitter region.

As is further illustrated in FIG. 3F, the second polysilicon layer 13 may be patterned by, for example, a photolithography process and an insulation film 14 formed on the exposed surfaces of the device. The insulation film 14 may then be etched or otherwise patterned to form a contact hole through the insulation film 14 to the second polysilicon layer 13. The bipolar transistor may be completed by depositing a conductive metal in the contact hole to provide an emitter contact 15 to the second polysilicon layer 13. As will be appreciated by those of skill in the art, base and collector contact holes may also be formed to allow contact to the first polysilicon layer 4 and the buried layer 2.

As will be appreciated by those of skill in this art, the preceding embodiments are provided, not to limit or define the scope of the present invention, but to illustrate the nature of the present invention and possible uses for the teachings of the present invention. These embodiments may be modified in many different ways while still obtaining the benefits of the teachings of the present invention. In the drawings and specification, there have been disclosed typical preferred embodiments of the invention and, although specific terms are employed, these terms are used in a generic and descriptive sense only and not for purposes of limitation, the scope of the invention being set forth in the following claims.

That which is claimed is:

1. A method of fabricating a bipolar transistor, the method comprising:

forming a layer of a second conductivity type semiconductor material on a substrate of a first conductivity type semiconductor material so as to provide an extrinsic collector region of the bipolar transistor; then forming a first conductive layer of polysilicon material on the layer of second conductivity type semiconductor material opposite the substrate; then patterning the first conductive layer to define a sidewall of a window which exposes a portion of the region of a second conductivity type semiconductor material; then forming an insulating layer on the sidewall and the exposed portion of the region of second conductivity type semiconductor material; then forming a first mask on the insulating layer which exposes a region of the insulating layer corresponding to a link-up region of the bipolar transistor; then implanting a first impurity ion of a first conductivity type through the insulating layer using the first mask to form a link-up region; then removing the first mask; then forming a sidewall spacer on the sidewall; and then implanting a second impurity ion of the first conductive type using the sidewall spacer as a mask; then diffusing the ions implanted by said step of implanting a second impurity to form an intrinsic base region; and diffusing ions from the polysilicon region into the region of second conductivity type semiconductor material so as to provide an extrinsic base region of the bipolar transistor; and forming an emitter region of the second conductivity type between the link-up regions.

2. A method for fabricating a bipolar transistor according to claim 1, wherein the sidewall spacer extends to cover the link-up region.

3. A method for fabricating a bipolar transistor according to claim 1, wherein said step of forming an emitter region comprises the steps of:

forming a second conductive layer of polysilicon material on the sidewall spacer and on a portion of the layer of second conductivity type semiconductor material corresponding to the intrinsic base region; and diffusing ions from the second conductive layer into the layer of second conductivity semiconductor material to form the emitter region of the bipolar device.

4. A method for fabricating a bipolar transistor according to claim 1 wherein said first conductivity type comprises p-type conductivity and wherein said second conductivity type comprises n-type conductivity.

5. A method according to claim 3, further comprising the steps of:

forming an insulation film on the second conductive layer;

forming a contact hole in the insulation film; and forming a metal contact through the contact hole to the second conductive layer to provide an emitter contact.

6. A method for fabricating a bipolar transistor, the method comprising the steps of:

forming a buried layer of a second conductivity type on a first conductivity type semiconductor substrate to provide an extrinsic collector region;

forming a second conductivity type epitaxial layer on the buried layer;

forming a first polysilicon layer of a first conductivity type on said epitaxial layer opposite said substrate;

forming a first oxide film on said first polysilicon layer opposite said epitaxial layer;

patterning said first polysilicon layer and said first oxide film to form a window which exposes said epitaxial layer;

forming a second oxide film on said exposed epitaxial layer;

forming a layer of a first material on said second oxide film opposite said first oxide film and said exposed epitaxial layer;

forming a layer of a second material on said layer of a first material and opposite said second oxide film;

forming a first sidewall spacer of a third material on said layer of a second material;

oxidizing the exposed layer of a second material using said first sidewall spacer as a mask;

removing said first sidewall spacer;

removing said layer of a second material and said layer of a first material using oxidized portions of said layer of second material as a mask;

implanting a first impurity ion of a first conductivity type using said oxidized portions as a mask to form link-up regions;

forming a second sidewall spacer to act as a mask for formation of an intrinsic base region between the link-up regions;

forming an intrinsic base region between the link-up regions and extrinsic base regions by diffusion; and forming an emitter region on the intrinsic base region.

7. A method for fabricating a bipolar transistor according to claim 6, wherein said patterning step comprises patterning said first oxide film and said first polysilicon layer by a photolithographic process to form a window.

8. A method for fabricating a bipolar transistor according to claim 7, wherein said first material and said third material are silicon nitride.

9. A method for fabricating a bipolar transistor according to claim 6, wherein said second material is polysilicon.

10. A method for fabricating a bipolar transistor according to claim 6, wherein said first sidewall spacer is removed by a wet etching process.

11. A method for fabricating a bipolar transistor according to claim 6, wherein said step of removing said first sidewall spacer is followed by the step of removing non-oxidized portions of said second material layer and the first material layer by an isotropic dry etching process.

12. A method for fabricating a bipolar transistor according to claim 1, wherein said implanting step is followed by the steps of:

removing oxidized portions of said layer of a second material and said layer of a first material;

removing said second oxide layer to expose said epitaxial layer within said window; and wherein said step of forming an intrinsic base region comprises implanting a second impurity ion of the first conductivity type using said second sidewall spacer as a mask.

* * * * *

UNITED STATES PATENT AND TRADEMARK OFFICE
CERTIFICATE OF CORRECTION

PATENT NO. : 5,747,374
DATED : May 5, 1998
INVENTOR(S) : Hee-Seog Jeon

It is certified that error appears in the above-identified patent and that said Letters Patent is hereby corrected as shown below:

Column 10, Line 12   Change "according to Claim 1" to -- according to Claim 6 --.

Signed and Sealed this

Twenty-ninth Day of December, 1998

Attest:

Attesting Officer

BRUCE LEHMAN
Commissioner of Patents and Trademarks